United States Patent
Dekker et al.

(10) Patent No.: US 6,593,628 B2
(45) Date of Patent: Jul. 15, 2003

(54) SEMICONDUCTOR DEVICE AND METHOD OF MANUFACTURING SAME

(75) Inventors: Ronald Dekker, Eindhoven (NL); Henricus Godefridus Rafael Maas, Eindhoven (NL); Jan Willem Slotboom, Eindhoven (NL); Freerk Van Rijs, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 22 days.

(21) Appl. No.: 09/819,280

(22) Filed: Mar. 28, 2001

(65) Prior Publication Data

US 2001/0045619 A1 Nov. 29, 2001

(30) Foreign Application Priority Data

Mar. 30, 2000 (EP) .............................. 00201141

(51) Int. Cl.$^7$ ........................ H01L 27/01; H01L 21/76
(52) U.S. Cl. .................. 257/351; 257/369; 257/525; 438/199; 438/322; 438/325; 438/323; 438/213; 438/218; 438/229
(58) Field of Search ................................ 438/199, 322, 438/323, 325, 327, 213, 218, 229; 257/351, 369, 525

(56) References Cited

U.S. PATENT DOCUMENTS

| | | | |
|---|---|---|---|
| 3,566,218 A | 2/1971 | Widlar et al. | 317/235 |
| 5,399,899 A | 3/1995 | Dekker et al. | 257/566 |
| 6,133,082 A * | 10/2000 | Masuoka | 438/199 |
| 6,171,911 B1 * | 1/2001 | Yu | 438/275 |
| 6,221,706 B1 * | 4/2001 | Lukanc et al. | 438/199 |
| 6,278,143 B1 * | 8/2001 | Ejiri | 257/273 |

FOREIGN PATENT DOCUMENTS

| | | |
|---|---|---|
| WO | 9603772 A2 | 2/1996 |
| WO | 9717726 A1 | 5/1997 |

\* cited by examiner

Primary Examiner—Matthew Smith
Assistant Examiner—V. Yevsikov
(74) Attorney, Agent, or Firm—Aaron Waxler

(57) ABSTRACT

The invention relates to an essentially discrete semiconductor device comprising a semiconductor body (10) having a first, preferably bipolar, transistor (T1) with a first region (1) forming a collector (1) of T1, and a second, preferably also bipolar, transistor (T2) with a second region (2) forming a collector (2) of T2, which transistors (T1, T2) are in a cascode configuration wherein the collector (1) of T1 is connected to the emitter (4) of T2. Such a device cannot suitably be used in a base station for mobile communication. According to the invention, the first region (1) and the second region (2) are positioned next to each other within a semiconductor region (5), a part of which situated below the first region (1) is provided with a higher doping concentration at the location of T1. In this way, T1 has a low collector-emitter breakdown voltage and a high cutoff frequency, whereas for T2 said voltage and frequency are, respectively, high(er) and low(er). The resultant device is very suitable, on the one hand, for a high voltage application, for example 28 V, and a high power application, for example 100 W and, on the other hand, the device can still operate at a very high speed and hence is very suitable for the above application. Moreover, the device can be manufactured very easily using a method according to the invention. Preferably, the device is rendered suitable for surface mounting, and the semiconductor body is attached to an isolating substrate (20), while the parts thereof that are situated outside T1 and T2 are removed.

10 Claims, 4 Drawing Sheets

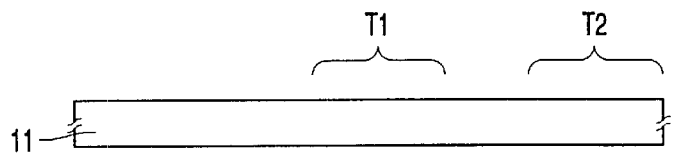
FIG. 5A
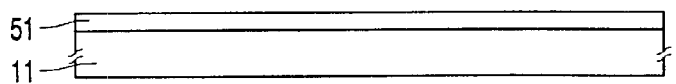
FIG. 5B
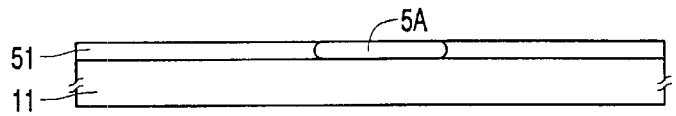
FIG. 5C
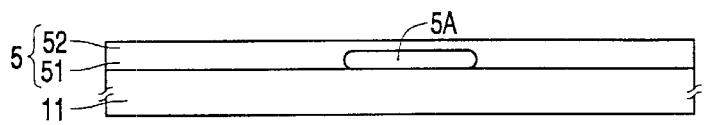
FIG. 5D
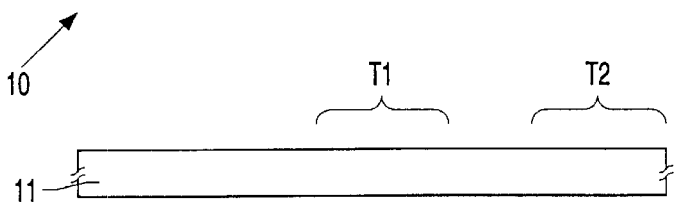
FIG. 6A
FIG. 6B
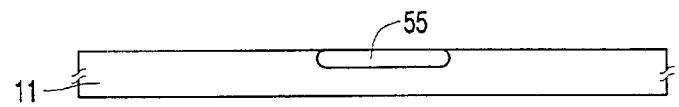
FIG. 6C
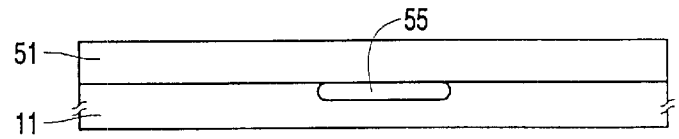
FIG. 6D
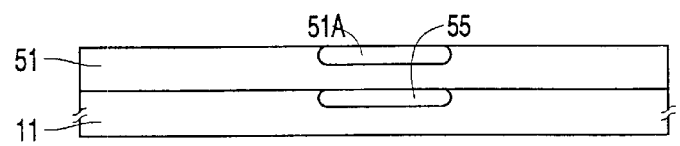
FIG. 6E
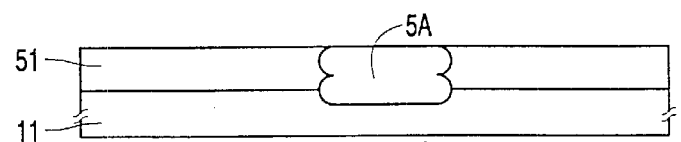
FIG. 6F
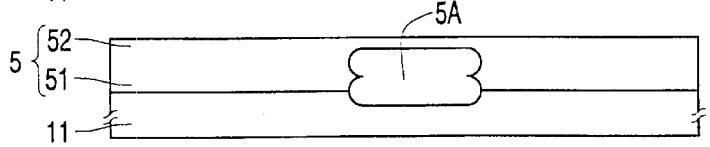
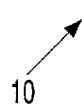

SEMICONDUCTOR DEVICE AND METHOD OF MANUFACTURING SAME

FIELD OF THE INVENTION

The invention relates to a semiconductor device comprising a semiconductor body having a first transistor provided with a first region forming a collector region or a drain region of the transistor, and with a second transistor provided with a second region forming a collector or drain region of the second transistor, which transistors are in a cascode configuration, the collector region or the drain region of the first transistor being connected to an emitter region or a source drain region of the second transistor. The invention also relates to a method of manufacturing such a device.

Such a device can be considered to be a type of divided transistor, with the first transistor being responsible for the current gain and the second transistor being responsible for the voltage gain.

BACKGROUND OF THE INVENTION

Such a device, and such a method, are disclosed in United States patent specification U.S. Pat. No. 5,399,899, published on Mar. 21, 1995. Said document discloses a cascode configuration of two transistors, in which the semiconductor body comprises a stack of regions, the lower regions of which form the first, in this case bipolar, transistor and the superjacent regions form the second transistor, which is also a bipolar transistor. A connection of the base region of the first transistor is made possible in that parts of the semiconductor body situated around the second transistor are etched away as far as the base region, said region also serving as an etch stop.

A drawback of the known device resides in that, without modifications, it cannot readily be used as a "discrete" transistor in a base station for mobile communication since this application requires a high power, a high (supply) voltage and a high speed. In addition, the known device cannot be readily manufactured owing to the use of an etch stop layer and the location of the electrical connections which are situated at two different levels.

Therefore, it is an object of the invention to provide a device which can particularly suitably be used for said application in a base station for mobile communication, and which can be readily manufactured.

SUMMARY OF THE INVENTION

To achieve this, a device of the type mentioned in the opening paragraph is characterized in accordance with the invention in that the first region and the second region are situated next to each other in a semiconductor region, a subjacent portion of which is provided, at the location of the first region, with a higher doping concentration. The invention is based first and foremost on the insight that by providing the first region in a smaller thickness than the second region, on the one hand, the cascode configuration is very suitable for supplying a high power of, for example, 100 W and for operation at a high (supply) voltage of, for example, 28 V and, on the other hand, can still operate at a very high speed. The first transistor, i.e. the "current amplifier" thus is a transistor having a low BVceo (=collector-emitter breakdown voltage) and a high a (=cutoff frequency), and the second transistor, i.e. the "voltage amplifier" has a high BVceo and a low fT. The invention is further based on the recognition that by placing the first and the second region next to each other within a single semiconductor region, it becomes possible to provide the electrical connections at one level. Finally, the invention is based on the important recognition that, if the first and the second region are placed next to each other and within a single semiconductor region, there is a simple method enabling the first and the second region to be provided with a different breakdown voltage. In accordance with this method, the slightly doped part of the collector region of the first transistor is provided in a smaller thickness than the slightly doped part of the collector region of the second transistor. As will be explained hereafter, said method comprises a combination of, for example, epitaxy and (local) ion implantation.

In a preferred embodiment of a device in accordance with the invention, the semiconductor body therefore comprises a semiconductor substrate on which an epitaxial layer is provided, which includes the semiconductor region. In a very favorable embodiment, the semiconductor body is attached to an insulating substrate by means of an adhesive layer, and the transistors are formed in mesa-shaped parts of the semiconductor body that is removed outside these parts. Such an insulation of the transistors ensures a minimum of additional/parasitic elements. As a result, the device in accordance with the invention is very fast. In addition, such a device can very suitably be embodied so as to be a SMD (=Surface Mounted Device), which enhances the compactness and hence also the speed. The electrical connection regions/connections of the cascode configuration are advantageously situated on the lower side, i.e. the semiconductor-substrate side, of the semiconductor body whose upper side adjoins the adhesive layer and the insulating substrate. Advantageously, the semiconductor body further comprises mesa-shaped recesses, which form (the remaining part of) the connection regions of the cascode configuration. The mesa-shaped parts are preferably provided with contact bumps, also referred to as "bumps", with a view to soldering and the SMD technique. This has the important additional advantage that a satisfactory heat dissipation, also of mesa-shaped parts which are not electrically connected, is ensured.

A method of manufacturing a semiconductor device comprising a semiconductor body having a first transistor provided with a first region forming a collector region or a drain region of the transistor, and a second transistor provided with a second region forming a collector region or a drain region of the second transistor, which transistors are in a cascode configuration, whereby the collector region or the drain region of the first transistor is connected to an emitter region or a source region of the second transistor, is characterized in accordance with the invention in that the first region and the second region are situated next to each other within a semiconductor region, a subjacent part of which is provided with a higher doping concentration at the location of the first region. In this manner, a device in accordance with the invention is achieved in a simple manner. Preferably, the semiconductor body is formed by providing a substrate with an epitaxial semiconductor layer, a part of which adjoining the substrate is locally provided with a higher doping concentration.

The epitaxial layer thus forms the semiconductor region and, for example by means of an ion implantation in the substrate, a local region is formed in advance, in the epitaxial layer, having a higher doping concentration within the semiconductor region, which ion implantation is subject to outdiffusion during the subsequent epitaxial process, or during a separate diffusion step. The thickness of this local region will, in principle, be equal to that of the epitaxial layer. The method in accordance with the invention can be continued by growing a second epitaxial layer. In this manner, two adjacent regions are formed, which are equal in doping concentration but different in thickness. In such a two-step epitaxial process, it is possible to advantageously carry out, after the first step, a local ion implantation in the epitaxial layer grown in the first step, whereafter the second epitaxial layer is provided.

In an advantageous embodiment, the semiconductor body is glued onto an insulating substrate, after the formation of the transistors, whereafter mesa-shaped parts are formed in the semiconductor body at the location of the transistors by locally etching away the semiconductor body. Preferably, additional mesa-shaped parts are formed in the semiconductor body, which form the connection regions of the cascode configuration of the transistors, and all parts are provided with contact bumps.

These and other aspects of the invention will be apparent from and elucidated with reference to the embodiment(s) described hereinafter.

BRIEF DESCRIPTION OF THE DRAWING

In the drawings:

FIGS. 6A through 6F are diagrammatic, cross-sectional views, at right angles to the thickness direction, of the device shown in FIG. 1 in a number of successive stages in the manufacturing process, using a second modification of a method in accordance with the invention.

DESCRIPTION OF THE PRIMARY EMBODIMENT

Figure 1:
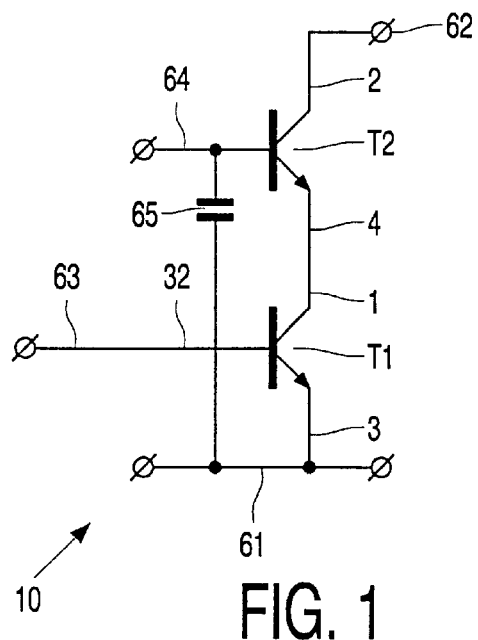
FIG. 1 diagrammatically shows the circuit diagram of a semiconductor device in accordance with the invention.

The Figures are diagrammatic and not drawn to scale; particularly the dimensions in the thickness direction are exaggerated for the sake of clarity. Semiconductor regions of the same conductivity type are generally hatched in the sane direction. Corresponding regions bear the same reference numeral whenever possible.

FIG. 1 diagrammatically shows the circuit diagram of a semiconductor device in accordance with the invention. Two transistors T1, T2 are in a so-called cascode configuration. This means that the emitter 3 of the first transistor T1 is connected to ground 61, while the collector 1 is connected to the emitter 4 of the second transistor T2, the collector (2, 11) of which is connected to output 62. The input signal is supplied to input 63, which is connected to the base 32 of T1. A constant DC (=Direct Current) voltage, for example of 2 V, is applied to a further input 64, which is connected to the base 42 of T2. A capacitor 65, for example of 20 pF, is arranged between the input 64 of T2 and ground 61. T1 serves, as it were, as a current amplifier and T2 as a voltage amplifier. The capacitor 65 serves as a decoupling capacitance and is intended to keep the base of T2 at a steady DC voltage.

Figure 2:
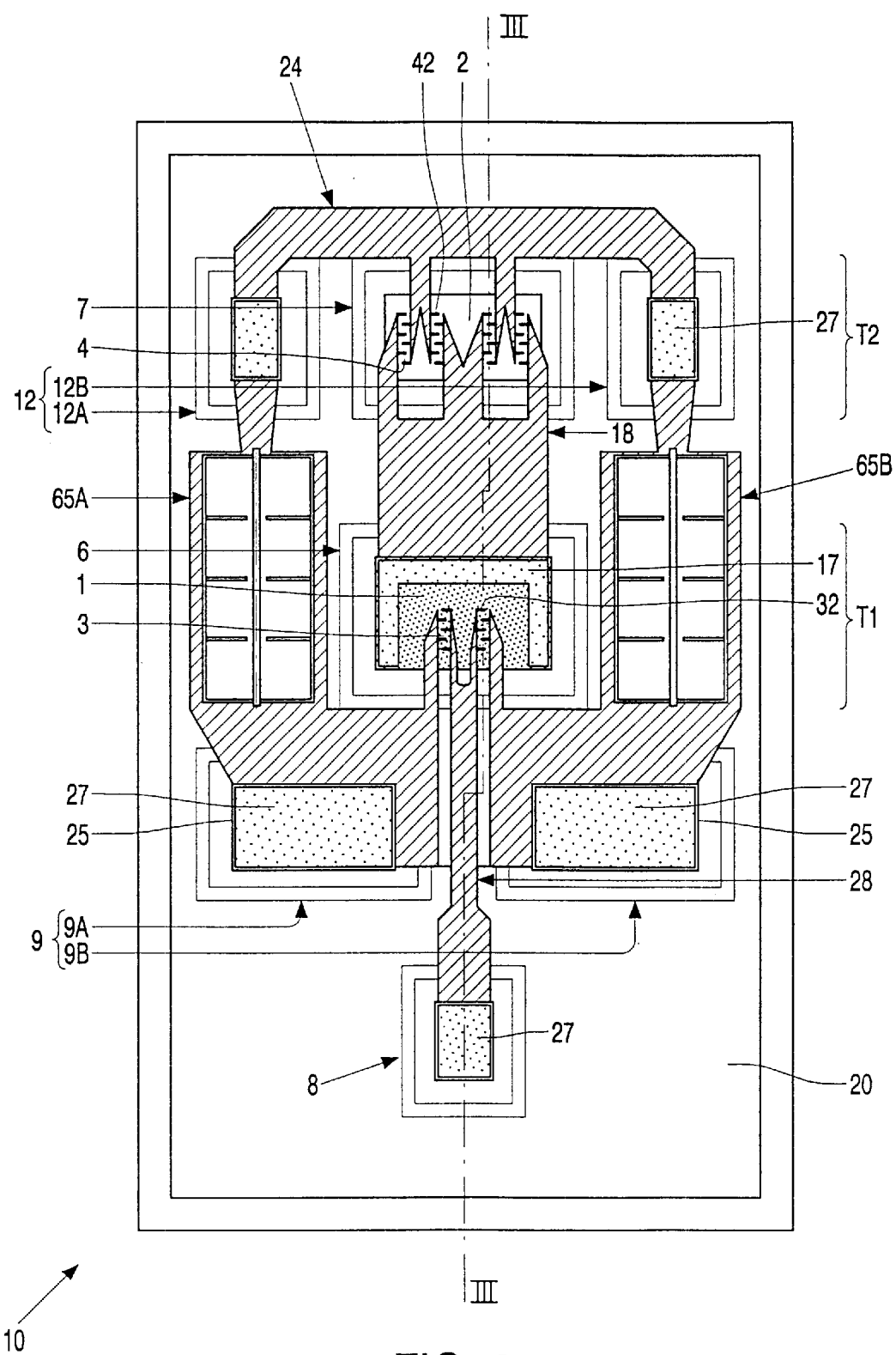
FIG. 2 is a diagrammatic plan view of an example of a semiconductor device in accordance with the invention.
Figure 3:
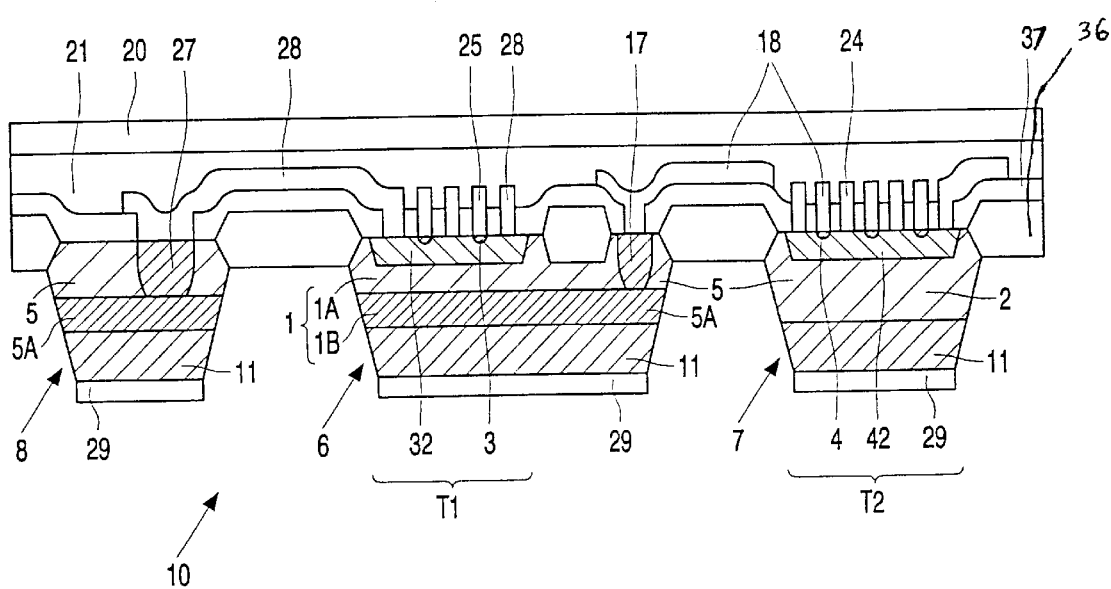
FIG. 3 is a diagrammatic, cross-sectional view, at right angles to the thickness direction and taken on the line II—II, of the device shown in FIG. 1

FIG. 2 is a diagrammatic plan view of a first embodiment of a semiconductor device in accordance with the invention, and FIG. 3 is a diagrammatic, cross-sectional view, at right angles to the thickness direction and taken on the line III—III, of the device shown in FIG. 1. The device comprises (see FIG. 3) a semiconductor body 10 which essentially includes three mesa-shaped semiconductor parts 6, 7 and 8, which are made from silicon. The first mesa-shaped part 6 comprises the first, bipolar, in this case NPN, transistor T1 having a collector region 1, a base region 32 and an emitter region 3. The first mesa-shaped part 6 also comprises a collector connection region 17 which is connected, by means of a first connection conductor 18 of, in this case, a heavily doped silicon, to the emitter region 4 of the second, also bipolar NPN, transistor T2 which is formed in the second mesa-shaped part 7. The third mesa-shaped part 8 forms, by means of a diffusion plug 27 and a connection conductor 28, a connection region 8 of the base 32 of T1. The lower side of part 8 is provided, as is the lower side of the parts 6, 7, with a metal layer 29 by means of which the electrical connection to a conductor track of a PCB (=Printed Circuit Board), not shown, is made. Instead of being electrically connected, the lower side of part 6 is connected to a conductor track on the PCB in order to cool part 6. The lower side of part 7 analogously provides for the electrical connection of the collector (2, 11) of T2. The base terminal of T2 is formed by conductor track 24 which, see FIG. 2, is symmetrically branched and leads to two further mesa-shaped parts 12A, 12B of the same construction as part 8 and serving as a terminal for connecting the base 42 of T2 to the PCB. The emitter 3 of T1 is also symmetrically branched and connected to ground via other mesa-shaped parts 9A, 9B, which serve as connection regions and are of the same construction as part 8. In this example, the base (terminals) 32, 42 and the emitter (terminals) 3, 4 of T1 and T2 are embodied so as to be finger-shaped. The same applies (see FIG. 2) to connection conductors inside the capacitor 65, which is embodied so as to comprise two symmetrically embodied and symmetrically connected parts 65A, 65B. Above the mesa-shaped parts 6, 7, 8, 9, 12, there is a first insulating layer 36 of silicon dioxide, which is formed as a LOCOS (=Local Oxidation of Silicon) oxide, above which a further insulating oxide layer 37 is formed by means of uniform oxidation.

In accordance with the invention, the first region 1 and the second region 2 are juxtaposed within a semiconductor region 5, a subjacent part 5A of which is provided with a higher doping concentration at the location of the first region 1. The invention is based first and foremost on the recognition that by providing the first region 1 in a smaller thickness than the second region 2, the cascode configuration is very suitable, on the one hand, for supplying a high power of, for example, 100 W and for operation at a high (supply) voltage of, for example, 28 V and, on the other hand, can still operate at a very high speed. T1 serves as a "current amplifier", as it were, and, by virtue of said measure, has a low BVceo (=collector-emitter breakdown voltage) and a high fT (=cutoff frequency), and T2 serves as a "voltage amplifier" and, by virtue of said measure, has a high BVceo and a low fT. In addition, the construction of T1 and T2 in accordance with the invention enables the electrical connections 24, 25, 27 on the one hand and 29 on the other hand to be formed within one plane. Finally, the invention is based on the important recognition that there is a simple method of arranging the first and the second region 1, 2 next to each other and within a single semiconductor region 5, while providing T1 and T2 with a different BVceo. The gist of this method is that (a slightly doped part 5A of) the collector region 1 of T1 is provided in a smaller thickness than (a slightly doped part of 2 of) the collector region (2, 11) of T2.

The dimensions of the device used in this example are: the mesa-shaped parts of the transistors T1, T2 have a width of approximately 500 μm, a length of 400 μm and a height of 50 μm, and the space between them is approximately 200 μm. The remaining mesa-shaped parts are slightly smaller. By virtue of the mesa-shaped parts 11, 12, 13, the device in accordance with the invention can very suitably be used for so-called SMD final assembly, and parasitic effects limiting the speed of the device are absent or at least substantially absent. The other dimensions of the transistor, as well as the doping concentrations of the various semiconductor regions, are, for example, equal to those of a known transistor. Reference is made to, for example, WO 96/03772.

Figure 4:
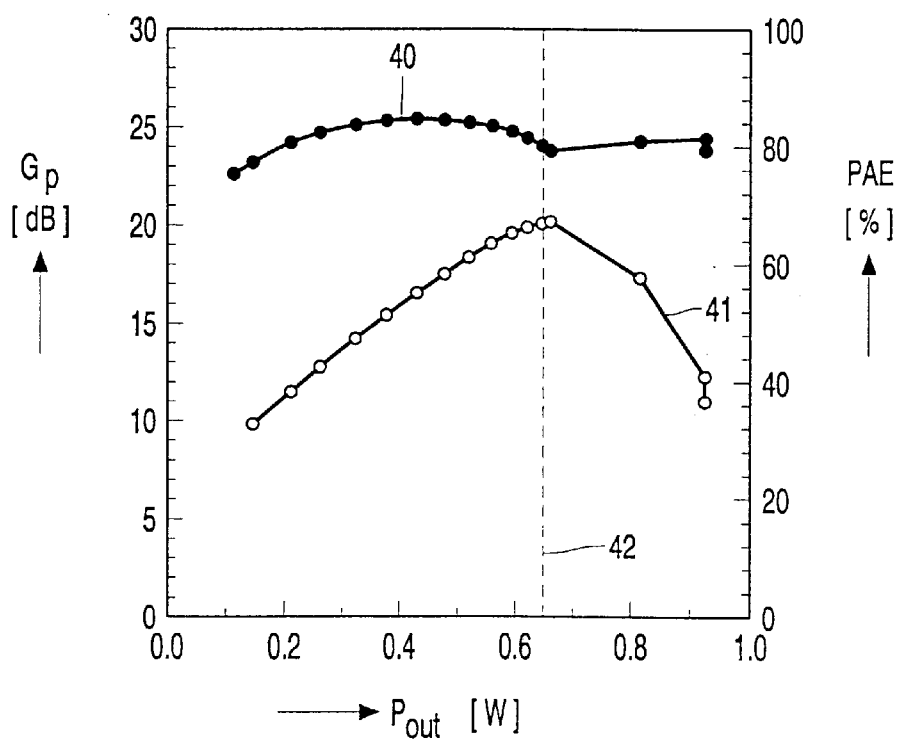
FIG. 4 shows the amplification (Gp) and the efficiency (PAE) as a function of the output power (Pout) of the device shown in FIG. 1, FIGS. 5A through 5D are diagrammatic, cross-sectional views, at right angles to the thickness direction, of the device shown in FIG. 1 in a number of successive stages in the manufacturing process, using a first modification of a method in accordance with the invention.

FIG. 4 shows the amplification (Gp, curve 40) and the efficiency (PAE, curve 41) of the device of this example. The Figure shows that, close to an operating point 42, the device in accordance with the invention has a high amplification (24 dB) and a high efficiency (66%), on the basis of a supply voltage of 15 V, a frequency of 1.8 GHz and a power of 0.6 W. Curve 40 confirms that the device in accordance with the invention is free of oscillations. The power of the device can be scaled up to a desired high level of, for example, 100 W.

FIGS. 5A through 5D are diagrammatic, cross-sectional views, at right angles to the thickness direction, of the device shown in FIG. 1 in a number of successive stages in the manufacturing process, using a first modification of a method in accordance with the invention. An n-type silicon substrate 11 is provided with an 1.5 μm thick, n⁻ type epitaxial layer 51. In said epitaxial layer, an n⁺ type region 5A is formed by means of ion implantation at the location of a bipolar transistor T1 to be formed. Subsequently, a second, also n⁻ type, epitaxial layer 52 is provided in a thickness of, for example, 1 μm. In this manner, a slightly doped epitaxial layer 5 is formed whose thickness at the location of T is smaller, for example 1 μm, than at the location of a second transistor T2 to be formed, at which location the thickness is, for example, 2.5 μm. In this manner, a device in accordance with the invention can be manufactured comprising a cascode configuration of T1 and T2, with the first transistor T1 having a low BVceo and a high fT, and T2 having a higher BVceo (and a lower fT), which device is capable of amplifying a high power at a high voltage and, at the same time, operates at a very high speed.

The rest of the manufacturing process broadly comprises the following steps. The semiconductor body 10 formed is provided with a thermal oxide layer, which is provided with an opening by means of photolithography and etching at the location of the mesa-shaped parts 6, 7, 8, 9, 12 to be formed, through which opening these parts are provided, if necessary, with an n-type diffusion that reaches as far as the region 5A which is not only formed at the location of T1 but also at those locations where a diffusion plug, such as plug 27, is required. Subsequently, use is made of standard techniques, which are known per se, such as oxidation, implantation and diffusion to form LOCOS (=Local Oxidation of Silicon) regions, the base 32, 42 and emitter regions 3, 4. A conductive layer 24, 25, 28, for example a Ti-TiN-AlSiCu layer is provided in a thickness of 1.1 μm on top of the (uppermost) insulating layer 37 by means of, for example, sputtering. This layer is provided with the desired pattern by means of photolithography and etching. Said patterned metal layer is provided with a scratch-resistant layer of silicon nitride, which is not shown in the drawing.

Next, an UV-curing adhesive layer comprising, in this case, a hexanedioldiacrylate adhesive, and an insulating substrate, in this case a 0.4 mm thick plate of glass, allowing the adhesive to be rapidly cured by means of UV radiation is provided on the semiconductor body 10. Next, the substrate 4 is reduced in thickness to 50 μm by means of, for example, a CMP (=Chemical Mechanical Polishing) process. Subsequently, the lower side of the semiconductor body 10 is covered, by means of electrodeposition, with a metal layer 29 of, for example, Ti—Cu with a view to final assembly by means of soldering. This metal layer is patterned by means of photolithography and etching, whereafter the semiconductor body 10 is locally removed by means of etching using a KOH-containing solution, resulting in the formation of the mesa-shaped parts 6, 7, 8, 9, 12. Finally, an individual device in accordance with the invention suitable for SMD final assembly is obtained by means of, for example, sawing. For further peculiarities, reference is also made to the manufacturing process as described in the above-mentioned patent application WO 96/03772.

FIGS. 6A through 6F are diagrammatic, cross-sectional views, at right angles to the thickness direction, of the device shown in FIG. 1 in a number of successive stages in the manufacturing process, using a second modification of a method in accordance with the invention. In this modification, first an n⁺ type ion implantation 55 is carried out locally in the substrate 11, i.e. at the location of the first transistor T1 to be formed. Next, a first epitaxial n⁻ type layer 51 is provided. In said epitaxial layer, a further ion implantation 51A is carried out locally, i.e. at the location of the region 55. Subsequently, the semiconductor body is subjected to a thermal treatment, for example at 1100° C., causing the regions 55, 51A to fuse together into a region 5A. Next, a second, n⁻ type epitaxial layer 52 is provided. This modification enables a comparatively large effective difference in thickness to be achieved within the epitaxial layer 5 between the slightly doped regions of T1 and T2. The thickness of the slightly doped region of the collector of T1 may be, for example, 5 μm, and the thickness of the slightly doped region of the collector of T2 may be 10 μm.

The invention is not limited to the examples described hereinabove since, within the scope of the invention, many modifications and variations are possible to those skilled in the art. For example, other compositions and thicknesses can be chosen for the various (semiconductor) regions or layers. The invention is not limited to SMD or discrete transistors. The invention can also be applied within CMOS or BIC-MOS technology. The semiconductor body does not have to be locally interrupted nor does it have to be secured to an insulating substrate. The invention can also be applied in a (completely) epitaxial transistor. Apart from a bipolar transistor, also a vertical MOS (=Metal Oxide Silicon) transistor can be used for the cascode configuration.

What is claimed is:

1. A semiconductor device comprising a semiconductor body (10) having a first transistor (T1) provided with a first region (1) forming a collector region (1) or a drain region of the transistor (T1), and a second transistor (T2) provided with a second region (2) forming a collector region or a drain region of the second transistor (T2), which transistors (T1, T2) are in a cascode configuration, the collector region (1) or the drain region of the first transistor (T1) being connected to an emitter region (4) or a source region of the second transistor (T2), characterized in that the first region (1) and the second region (2) are situated next to each other in a semiconductor region (5), a subjacent part (5A) of the semiconductor region is provided with a higher doping concentration at the location of the first region (1) than at the second region, further characterized in that the semiconductor body (10) comprises a semiconductor substrate (11) on which an epitaxial layer (5) is provided, which includes the semiconductor region (5).

2. A semiconductor device as claimed in claim 1, characterized in that the semiconductor body (10) is attached to an insulating substrate (20) by means of an adhesive layer (21), and the transistors (T1, T2) are formed in mesa-shaped parts (7, 8) of the semiconductor body (10).

3. A semiconductor device as claimed in claim 2, characterized in that connection regions (8, 9, 12) of the cascode configuration of transistors are formed in further mesa-shaped parts (8, 9, 12) of the semiconductor body (10), and both the mesa-shaped parts (7, 8) and the further mesa-shaped parts (8, 9, 12) are provided with contact bumps (29).

4. A semiconductor device as claimed in claim 1, wherein the first region comprises a first and second sub-region, and wherein the first sub-region comprises the same doping concentration as the second region.

5. A semiconductor device as claimed in claim 4, wherein the first sub-region is less thick than the second region.

6. A method of manufacturing a semiconductor device comprising a semiconductor body (10) comprising: providing a first transistor (T1) with a first region (1); forming a collector region (1) or a drain region of the transistor (T1); providing a second transistor (T2) with a second region (2); forming a collector region (2) or a drain region of the second transistor (T2), which transistors (T1, T2) are formed so as to be in a cascode configuration; connecting the collector region (1) or the drain region (100) of the first transistor (T1) to an emitter region (4) or a source region (300) of the second transistor (T2), characterized in that the first region (1) and the second region (2) are formed next to each other within a semiconductor region (5), a subjacent part (5A) of the semiconductor region is provided with a higher doping concentration at the location of the first region (1) than at the second region, further characterized in that the semiconductor body (10) is formed by providing an epitaxial semiconductor layer (5) on a semiconductor substrate (11), a part (5A) of said epitaxial semiconductor layer adjoining the substrate (11) being locally provided with a higher doping concentration.

7. A method as claimed in claim 6, characterized in that, prior to the step of providing the epitaxial layer (5), a further semiconductor region (55) having a high doping concentration is locally formed in a part (11) of the semiconductor body (10) lying below said epitaxial layer.

8. A method as claimed in claim 6, characterized in that the epitaxial layer (5) is formed from two sub-layers (51, 52) and, prior to the application of the second sub-layer (52), a part (51A, 5A) of the first sub-layer (51) is provided with a higher doping concentration than at the second region.

9. A method as claimed in claim 6, characterized in that the semiconductor body (10) is glued onto an insulating substrate (20), after the formation of the transistors (T1, T2), whereafter mesa-shaped parts (6, 7) are formed in the semiconductor body (10) at the location of the transistors (T1, T2) by locally etching away the semiconductor body (10).

10. A method as claimed in claim 9, characterized in that additional mesa-shaped parts (8, 9, 12) are formed in the semiconductor body (10), which form connection regions (8, 9, 12) of the cascode configuration of the transistors (T1, T2), and the mesa-shaped parts (7, 8) and further parts (8, 9, 12) are provided with contact bumps (29).

* * * * *